(12) United States Patent
Wang et al.

(10) Patent No.: US 11,063,605 B2
(45) Date of Patent: Jul. 13, 2021

(54) CODE BLOCK SEGMENTATION METHOD, TERMINAL, BASE STATION, AND COMPUTER-READABLE STORAGE MEDIUM

(71) Applicant: CHINA ACADEMY OF TELECOMMUNICATIONS TECHNOLOGY, Beijing (CN)

(72) Inventors: Jiaqing Wang, Beijing (CN); FangChen Cheng, Beijing (CN); Shaohui Sun, Beijing (CN)

(73) Assignee: CHINA ACADEMY OF TELECOMMUNICATIONS TECHNOLOGY, Beijing (CN)

( * ) Notice: Subject to any disclaimer, the term of this patent is extended or adjusted under 35 U.S.C. 154(b) by 0 days.

(21) Appl. No.: 16/630,831

(22) PCT Filed: Jun. 28, 2018

(86) PCT No.: PCT/CN2018/093333
§ 371 (c)(1),
(2) Date: Jan. 13, 2020

(87) PCT Pub. No.: WO2019/011130
PCT Pub. Date: Jan. 17, 2019

(65) Prior Publication Data
US 2020/0145024 A1    May 7, 2020

(30) Foreign Application Priority Data
Jul. 14, 2017    (CN) .......................... 201710576847.8

(51) Int. Cl.
*H03M 13/11* (2006.01)
*H03M 13/00* (2006.01)
*H04L 1/00* (2006.01)

(52) U.S. Cl.
CPC ... *H03M 13/1102* (2013.01); *H03M 13/6508* (2013.01); *H04L 1/0058* (2013.01); *H03M 13/6525* (2013.01)

(58) Field of Classification Search
CPC .................................................. H03M 13/1102
(Continued)

(56) References Cited

U.S. PATENT DOCUMENTS 10,772,096 B2 *  9/2020  Gao .................... H04L 5/0053
2010/0287441 A1  11/2010  Seo et al.
(Continued)

FOREIGN PATENT DOCUMENTS

CN    101867440 A    10/2010
CN    102315911 A    1/2012
(Continued)

OTHER PUBLICATIONS

Extended European Search Report from EP app. No. 18832612.8, dated Jul. 2, 2020.
(Continued)

*Primary Examiner* — Fritz Alphonse
(74) *Attorney, Agent, or Firm* — Ladas & Parry, LLP

(57) ABSTRACT

The code block segmentation method includes: a base station determining whether to use the maximum length of a first pre-set information bit for code block segmentation or to use the maximum length of a second pre-set information bit for code block segmentation; if it is determined to use the maximum length of the first pre-set information bit for code block segmentation, the base station segmenting a transport block into one or more segments by taking the maximum length of the first pre-set information bit as an upper limit; and if it is determined to use the maximum length of the second pre-set information bit for code block segmentation, the base station segmenting a transport block into one or (Continued)

more segments by taking the maximum length of the second pre-set information bit as an upper limit, wherein the maximum length of the first pre-set information bit is greater than the maximum length of the second pre-set information bit.

20 Claims, 6 Drawing Sheets

(58) Field of Classification Search
USPC .................................. 714/752, 749, 751, 754
See application file for complete search history.

(56) References Cited

U.S. PATENT DOCUMENTS

| | | | |
|---|---|---|---|
| 2015/0117496 A1* | 4/2015 | Johansson | H04B 1/7097 375/146 |
| 2015/0146644 A1* | 5/2015 | Kim | H04L 5/0035 370/329 |
| 2015/0207601 A1* | 7/2015 | Kim | H04L 5/005 370/329 |
| 2017/0126378 A1 | 5/2017 | Luo et al. | |
| 2018/0123847 A1 | 5/2018 | Xu et al. | |
| 2018/0205497 A1 | 7/2018 | Wang et al. | |
| 2019/0268926 A1* | 8/2019 | Yoshimura | H04L 27/26 |
| 2020/0266963 A1* | 8/2020 | Song | H04L 5/0051 |

FOREIGN PATENT DOCUMENTS

| | | |
|---|---|---|
| CN | 102594492 A | 7/2012 |
| CN | 106160937 A | 11/2016 |
| CN | 106160987 A | 11/2016 |
| CN | 106788900 A | 5/2017 |
| JP | 2020505836 A | 2/2020 |
| KR | 20140123397 A | 10/2014 |
| WO | 2009017814 A2 | 2/2009 |
| WO | 2010118592 A1 | 10/2010 |
| WO | 2009017814 A3 | 1/2012 |

OTHER PUBLICATIONS

First Office Action and Search Report from CN app. No. 201710576847. 8, dated Jan. 2, 2020, with English translation from Global Dossier.
Written Opinion of the International Searching Authority from PCT/CN2018/093333, dated Sep. 19, 2018, with English translation from WIPO.
International Preliminary Report on Patentability from PCT/CN2018/093333, dated Jan. 14, 2020, with English translation from WIPO.
"Status Report for RAN WG1 to TSG-RAN #76", RP-170858, 3GPP TSG RAN #76, Florida, USA, Jun. 5-8, 2017.
"Code Block Segmentation for LDPC Codes", R1-1701629, 3GPP TSG-RAN WG1#88, Athens, Greece, Feb. 13-17, 2017.
"Status Report to TSG", RP-1711505, 3GPP TSG RAN meeting #76, West Palm Beach, USA, Jun. 5-8, 2017.
International Search Report in the international application No. PCT/CN2018/093333, dated Sep. 19, 2018.
Written Opinion of the International Searching Authority in the international application No. PCT/CN2018/093333, dated Sep. 19, 2018 with English translation provided by Google Translate.
Notice of Reasons for Refusal from JP app. No. 2020-501454, dated Mar. 16, 2021, with English translation from Global Dossier.
Notification of Reason for Refusal from KR app. No. 10-2020-7004183, dated Apr. 26, 2021, with English translation from Global Dossier.
"Rate Matching for LDPC Codes", R1-1611322, 3GPP TSG RAN WG1 Meeting #87, Reno, USA, Nov. 14-18, 2016.
"Code block segmentation of eMBB", R1-1708826, 3GPP TSG RAN WG1 Meeting #89, Hangzhou, P.R. China, May 15-19, 2017.
"Throughput Requirements of LDPC Decoder", R1-1710486, 3GPP TSG RAN WG1 NR Ad-Hoc#2, Qingdao, P.R. China, Jun. 27-30, 2017.
"LDPC Coding Chain", R1-1711344, 3GPP TSG RAN WG1 NR Ad-Hoc#2, Qingdao, P.R. China, Jun. 27-30, 2017.

\* cited by examiner

CODE BLOCK SEGMENTATION METHOD, TERMINAL, BASE STATION, AND COMPUTER-READABLE STORAGE MEDIUM

CROSS-REFERENCE TO RELATED APPLICATIONS

The present application is the U.S. national phase of PCT Application No. PCT/CN2018/093333 filed on Jun. 28, 2018, which claims priority to the Chinese patent application 201710576847.8 filed on Jul. 14, 2017, the disclosures of which are incorporated herein by reference in their entireties.

TECHNICAL FIELD

The present disclosure relates to the field of communication technologies, in particular to a code block segmentation method, a terminal, a base station, and a computer readable storage medium.

BACKGROUND

The 3rd Generation Partnership Project (3GPP) uses a Low Density Parity Check Code (LDPC) for an Enhanced Mobile Broadband (eMBB) application scenario of the fifth generation mobile communication technology (5G) New Radio (NR).

The LDPC uses an improvement scheme for a base graph to obtain a check matrix that supports a specific information length and a code rate, thereby performing coding and decoding. Using a base graph designed for a large information block length will degrade the performance of the short information block LDPC, and will also reduce the latency of the short information block, which is particularly go against the low latency requirement of the Ultra-high Reliability and Low Latency Communication (URLLC) scenarios. Therefore, some companies propose to use multiple base graphs, and different base graphs can support different information lengths and bit rates.

In order to make a compromise between the performance and the complexity, the LDPC coding scheme with two base graphs used in the NR is determined in the 3GPP. The size of the large base graph in two base graphs is 46×68 columns, the first 22 columns correspond to information bits, and the lowest code rate is 1/3; and the size of the small base graph is 42×52 columns, and the lowest code rate is 1/5. Unlike the large base graph, in order to improve the decoding performance and reduce the decoding latency, the current conclusion in the 3GPP is that when the information bit K is greater than 640, the first 10 columns of the base graph map the information bit. When the information bit K is greater than 560, and less than or equal to 640, the first 9 columns of the base graph map the information bit. When the information bit K is greater than 192, and less than or equal to 560, the first 8 columns of the base graph map the information bit. When the information bit K is greater than 40, and less than or equal to 192, the first 6 columns of the base graph map the information bit.

According to the Long Term Evolution (LTE) protocol, a base station and a terminal obtain Modulation Coding Scheme (MCS) information in Downlink Control Information (DCI), query the stored MCS table to obtain a Transport Block size (TBs) and the value of the target R, and then perform code block segmentation according to the maximum information block length Kmax=6144 of the LTE-Turbo code. The goal is to make each code block segment as large as possible and approximately equal. The specific idea is as follows: after the TB (Transport Block) size is determined, if the TB size is less than the Kmax, the TB is divided into a code block; if the TB size is greater than the Kmax, the length B of the TB is divided by (Kmax-L) to obatin number of code blocks C=⌈B/(K max−L)⌉, wherein the L is a 24-bit Cyclic Redundancy Check (CRC) in the LTE protocol; and then, according to the number C of code blocks, the TB length B and the number L of CRCs, interleaving length of the Turbo code with the minimal zero padding is selected to complete the code block segmentation procedure.

However, there are two base graphs for the LDPC. Because there are two maximum information block lengths, the code block segmentation method cannot reuse the code block segmentation design in the LTE completely. Therefore, a new code block segmentation scheme is needed urgently.

SUMMARY

In view of the above technical problem, embodiments of the present disclosure provide a code block segmentation method, a terminal, a base station, and a computer readable storage medium, so as to effectively solve the technical problem of code block segmentation with two maximum information block lengths.

Provided is a code block segmentation method according to a first aspect of an embodiment of the present disclosure, including:

a base station determining whether to use a maximum length of a first predetermined information bit for code block segmentation or to use a maximum length of a second predetermined information bit for code block segmentation;

if it is determined to use the maximum length of the first predetermined information bit for code block segmentation, the base station segmenting a transport block into one or more segments by taking the maximum length of the first predetermined information bit as an upper limit; and if it is determined to use the maximum length of the second predetermined information bit for code block segmentation, the base station segmenting the transport block into one or more segments by taking the maximum length of the second predetermined information bit as the upper limit;

wherein the maximum length of the first predetermined information bit is greater than the maximum length of the second predetermined information bit.

In some possible embodiments of this disclosure, the base station determining whether to use a maximum length of a first predetermined information bit for code block segmentation or to use a maximum length of a second predetermined information bit for code block segmentation includes:

the base station determining a type of a base graph;

if the type of the base graph is a first base graph, the base station determining to use the maximum length of the first predetermined information bit for code block segmentation;

if the type of the base graph is a second base graph, the base station determining to use the maximum length of the second predetermined information bit for code block segmentation;

wherein a lowest code rate of the first base graph is greater than a lowest code rate of the second base graph.

In some possible embodiments of this disclosure, after the base station determining a type of a base graph, the method further includes:

the base station indicating the type of the base graph via signaling.

In some possible embodiments of this disclosure, the base station indicating the type of the base graph via signaling includes:

the base station indicating the type of the base graph via dynamic signaling, static signaling or semi-static signaling.

In some possible embodiments of this disclosure, the base station determining whether to use a maximum length of a first predetermined information bit for code block segmentation or to use a maximum length of a second predetermined information bit for code block segmentation includes:

the base station determining a code rate value in transmission;

if the code rate value is greater than a first predetermined value, the base station determining to use the maximum length of the first predetermined information bit for code block segmentation;

if the code rate value is less than or equal to the first predetermined value, the base station determining to use the maximum length of the second predetermined information bit for code block segmentation;

wherein the maximum length of the first predetermined information bit is greater than the maximum length of the second predetermined information bit.

In some possible embodiments of this disclosure, the base station determining a code rate value in transmission includes:

the base station calculating the code rate value in each transmission according to a transport block size, a scheduled resource size, and a modulation and coding scheme in actual transmission.

In some possible embodiments of this disclosure, the base station determining a code rate value in transmission includes:

the base station determining the code rate value in transmission according to indication information.

Provided is a code block segmentation method according to a second aspect of an embodiment of the present disclosure, including:

a terminal determining whether to use a maximum length of a first predetermined information bit for code block segmentation or to use a maximum length of a second predetermined information bit for code block segmentation;

if it is determined to use the maximum length of the first predetermined information bit for code block segmentation, the terminal segmenting a transport block into one or more segments by taking the maximum length of the first predetermined information bit as an upper limit; and if it is determined to use the maximum length of the second predetermined information bit for code block segmentation, the terminal segmenting the transport block into one or more segments by taking the maximum length of the second predetermined information bit as the upper limit;

wherein the maximum length of the first predetermined information bit is greater than the maximum length of the second predetermined information bit.

In some possible embodiments of this disclosure, the terminal determining whether to use a maximum length of a first predetermined information bit for code block segmentation or to use a maximum length of a second predetermined information bit for code block segmentation includes:

the terminal determining a type of a base graph;

if the type of the base graph is a first base graph, the terminal determining to use the maximum length of the first predetermined information bit for code block segmentation;

if the type of the base graph is a second base graph, the terminal determining to use the maximum length of the second predetermined information bit for code block segmentation;

wherein a lowest code rate of the first base graph is greater than a lowest code rate of the second base graph.

In some possible embodiments of this disclosure, the terminal determining a type of a base graph includes:

the terminal determining the type of the base graph via signaling indication from a base station.

In some possible embodiments of this disclosure, the terminal determining the type of the base graph via signaling indication from a base station includes:

the terminal determining the type of the base graph via dynamic signaling, static signaling or semi-static signaling indication from the base station.

In some possible embodiments of this disclosure, the terminal determining whether to use a maximum length of a first predetermined information bit for code block segmentation or to use a maximum length of a second predetermined information bit for code block segmentation includes:

the terminal determining a code rate value in transmission;

if the code rate value is greater than a first predetermined value, the terminal determining to use the maximum length of the first predetermined information bit for code block segmentation;

if the code rate value is less than or equal to the first predetermined value, the terminal determining to use the maximum length of the second predetermined information bit for code block segmentation;

wherein the maximum length of the first predetermined information bit is greater than the maximum length of the second predetermined information bit.

In some possible embodiments of this disclosure, the terminal determining a code rate value in transmission includes:

the terminal determining a code rate value in transmission according to the signaling indication from a base station.

In some possible embodiments of this disclosure, the terminal determining a code rate value in transmission includes:

the terminal determining the code rate value in transmission according to indication information.

Provided is a base station according to a third aspect of an embodiment of the present disclosure, including:

a first determination module, configured to determine whether to use a maximum length of a first predetermined information bit for code block segmentation or to use a maximum length of a second predetermined information bit for code block segmentation;

a first segmentation module configured to, if the first determination module determines to use the maximum length of the first predetermined information bit for code block segmentation, segment a transport block into one or more segments by taking the maximum length of the first predetermined information bit as an upper limit; and a second segmentation module configured to, if the first determination module determines to use the maximum length of the second predetermined information bit for code block segmentation, segment the transport block into one or more segments by taking the maximum length of the second predetermined information bit as the upper limit;

In some possible embodiments of this disclosure, the maximum length of the first predetermined information bit is greater than the maximum length of the second predetermined information bit.

In some possible embodiments of this disclosure, the first determination module includes:

a first determination unit, configured to determine a type of a base graph;

a second determination unit configured to, if the type of the base graph is a first base graph, determine to use the maximum length of the first predetermined information bit for code block segmentation;

a third determination unit configured to, if the type of the base graph is a second base graph, determine to use the maximum length of the second predetermined information bit for code block segmentation;

wherein a lowest code rate of the first base graph is greater than a lowest code rate of the second base graph.

In some possible embodiments of this disclosure, the first determination unit is further configured to: indicate the type of the base graph via signaling.

In some possible embodiments of this disclosure, the first determination unit is further configured to: indicate the type of the base graph via dynamic signaling, static signaling or semi-static signaling.

In some possible embodiments of this disclosure, the first determination module includes:

a fourth determination unit, configured to determine a code rate value in transmission;

a fifth determination unit configured to, if the code rate value is greater than a first predetermined value, determine to use the maximum length of the first predetermined information bit for code block segmentation;

a sixth determination unit configured to, if the coding rate value is less than or equal to the first predetermined value, determine to use the maximum length of the second predetermined information bit for code block segmentation;

wherein the maximum length of the first predetermined information bit is greater than the maximum length of the second predetermined information bit.

In some possible embodiments of this disclosure, the fourth determination unit is further configured to: calculate the code rate value in each transmission according to a transport block size, a scheduled resource size, and a modulation and coding scheme in actual transmission.

In some possible embodiments of this disclosure, the fourth determination unit is further configured to: determine the code rate value in transmission according to indication information.

Provided is a terminal according to a fourth aspect of an embodiment of the present disclosure, including:

a second determination module, configured to determine whether to use a maximum length of a first predetermined information bit for code block segmentation or to use a maximum length of a second predetermined information bit for code block segmentation;

a third segmentation module configured to, if the second determination module determines to use the maximum length of the first predetermined information bit for code block segmentation, segment a transport block into one or more segments by taking the maximum length of the first predetermined information bit as an upper limit; and a fourth segmentation module configured to, if the second determination module determines to use the maximum length of the second predetermined information bit for code block segmentation, segment the transport block into one or more segments by taking the maximum length of the second predetermined information bit as the upper limit;

wherein the maximum length of the first predetermined information bit is greater than the maximum length of the second predetermined information bit.

In some possible embodiments of this disclosure, the second determination module includes:

a seventh determination unit, configured to determine a type of a base graph;

an eighth determination unit configured to, if the type of the base graph is a first base graph, determine to use the maximum length of the first predetermined information bit for code block segmentation;

a ninth determination unit configured to, if the type of the base graph is a second base graph, determine to use the maximum length of the second predetermined information bit for code block segmentation;

wherein a lowest code rate of the first base graph is greater than a lowest code rate of the second base graph.

In some possible embodiments of this disclosure, the seventh determination unit is further configured to: determine the type of the base graph via signaling indication from a base station.

In some possible embodiments of this disclosure, the seventh determination unit is further configured to: determine the type of the base graph via dynamic signaling, static signaling or semi-static signaling indication from the base station.

In some possible embodiments of this disclosure, the second determination module includes:

a tenth determination unit, configured to determine a code rate value in transmission;

an eleventh determination unit configured to, if the code rate value is greater than a first predetermined value, determine to use the maximum length of the first predetermined information bit for code block segmentation;

a twelfth determination unit configured to, if the coding rate value is less than or equal to the first predetermined value, determine to use the maximum length of the second predetermined information bit for code block segmentation;

wherein the maximum length of the first predetermined information bit is greater than the maximum length of the second predetermined information bit.

In some possible embodiments of this disclosure, the tenth determination unit is further configured to: determine a code rate value in transmission according to the signaling indication from a base station.

In some possible embodiments of this disclosure, the tenth determination unit is further configured to: determine the code rate value in transmission according to indication information.

Provided is a base station according to a fifth aspect of an embodiment of the present disclosure, including: a memory, a processor and a computer program stored in the memory and executable on the processor; wherein the processor executes the program to implement steps of the code block segmentation method described as above.

Provided is a terminal according to a sixth aspect of an embodiment of the present disclosure, including: a memory, a processor and a computer program stored in the memory and executable on the processor; wherein the processor executes the program to implement steps of the code block segmentation method described as above.

Provided is a computer readable storage medium according to a seventh aspect of an embodiment of the present disclosure, having a computer program stored therein, wherein the program is executed by a processor to implement steps of the code block segmentation method described as above.

One of the above technical solutions has the following advantages or beneficial effects: if the base station or the terminal determines to use the maximum length of the first predetermined information bit for code block segmentation, the base station or the terminal segments the transport block into one or more segments by taking the maximum length of the first predetermined information bit as the upper limit; and if the base station or the terminal determines to use the maximum length of the second predetermines information bit for code block segmentation, the base station or the terminal segments the transport block into one or more segments by taking the maximum length of the second predetermines information bit as the upper limit; wherein the maximum length of the first predetermined information bit is greater than the maximum length of the second predetermined information bit, so as to effectively solve the technical problem of code block segmentation with two maximum information block lengths.

Whether to use the maximum length of the first predetermined information bit for code block segmentation or to use the maximum length of the second predetermined information bit for code block segmentation can be determined by means of signaling indication or code rate identification. For example, since the lowest code rate corresponding to the first base graph may only be 1/3, for cell edge users, if the code rate is less than 1/3, by adopting the method in the present embodiment, it can make full use of the maximum length of the second predetermined information bit corresponding to the second base graph corresponding to the code rate of 1/5 for code block segmentation, thereby effectively improving system performance.

BRIEF DESCRIPTION OF THE DRAWINGS

In order to more clearly illustrate the technical solutions in embodiments of the present disclosure or in related technologies, the drawings used in the description of the embodiments will be briefly introduced below. Obviously, the drawings in the following description are only some embodiments of the present disclosure. Based on these drawings, other drawings may be obtained by those skilled in the art without any creative work.

DETAILED DESCRIPTION

Figure 1:
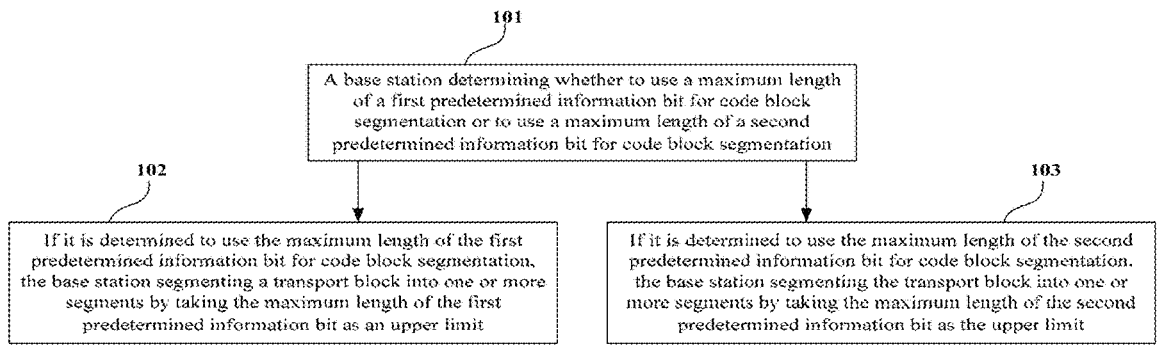
FIG. 1 is a flow chart illustrating a code block segmentation method at a base station side according to some embodiments of the present disclosure.

Exemplary embodiments of the present disclosure will be described in more detail below with reference to the accompanying drawings. Although exemplary embodiments of the present disclosure are shown in the drawings, it should be understood that various exemplary embodiments of the present disclosure may be implemented in various forms and should not be limited by the embodiments described herein. Rather, these embodiments are provided so that this disclosure will be thorough and complete, and will fully convey the scope of the disclosure to those skilled in the art.

In the following various specific embodiments, the base station can be various types of base stations known in the communication technology field, or other types of base stations that will be introduced in the future, such as NB, eNB, and gNB, and various macro stations or small base stations, etc., various embodiments of the present disclosure are not limited thereto. In addition, the terminal may also be various types of terminals known in the communication technology field, including but not limited to a mobile phone, a notebook computer, a data terminal equipment, or a portable terminals (PAD), etc., the embodiments of the present disclosure are not limited thereto.

Referring to FIG. 1, a flow chart illustrating a code block segmentation method at a base station side according to some embodiments of the present disclosure is illustrated, and the specific steps are as follows.

A step 101 includes: a base station determining whether to use a maximum length of a first predetermined information bit for code block segmentation or to use a maximum length of a second predetermined information bit for code block segmentation.

A step 102 includes: if it is determined to use the maximum length of the first predetermined information bit for code block segmentation, the base station segmenting a transport block into one or more segments by taking the maximum length of the first predetermined information bit as an upper limit.

A step 103 includes: if it is determined to use the maximum length of the second predetermined information bit for code block segmentation, the base station segmenting the transport block into one or more segments by taking the maximum length of the second predetermined information bit as the upper limit.

The maximum length of the first predetermined information bit is greater than the maximum length of the second predetermined information bit, for example.

In the present disclosure, as a non-limiting example, the first base graph (also referred to as base graph #1) corresponds to the maximum length of the first predetermined information bit, the second base graph (also referred to as base graph #2) corresponds to the maximum length of the second predetermined information bit. If the base station determines to use the maximum length of the first predetermined information bit for code block segmentation, the base station segments the transport block into one or more segments by taking the maximum length of the first predetermined information bit as the upper limit. In addition, if the base station determines to use the maximum length of the second predetermined information bit for code block segmentation, the base station segments the transport block into one or more segments by taking the maximum length of the second predetermined information bit as an upper limit. The maximum length of the first predetermined information bit is greater than the maximum length of the second predetermined information bit, and it can effectively solve the technical problem of code block segmentation when there are two maximum information block lengths.

Figure 2:
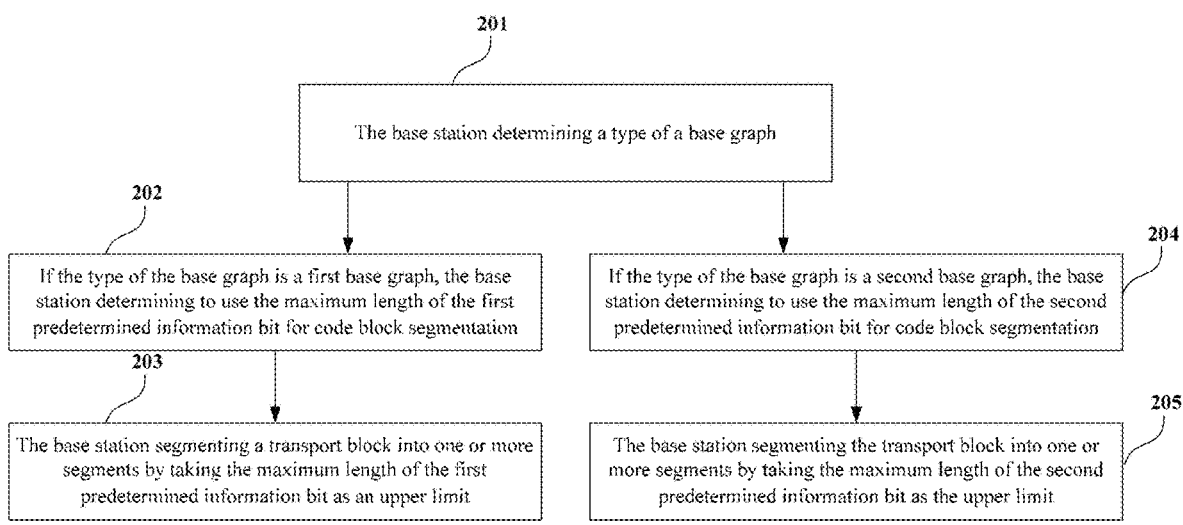
FIG. 2 is another flow chart illustrating a code block segmentation method at a base station side according to some embodiments of the present disclosure.

Referring to FIG. 2, another flow chart illustrating a code block segmentation method at a base station side according to some embodiments of the present disclosure is illustrated, and the specific steps are as follows.

A step 201 includes: the base station determining a type of a base graph.

For example, the base station indicates the type of the base graph via signaling, specifically, the base station indicates the type of the base graph via dynamic signaling, static signaling or semi-static signaling.

A step 202 includes: if the type of the base graph is a first base graph, the base station determining to use the maximum length of the first predetermined information bit for code block segmentation.

As a non-limiting example, the first base graph can be referred to as base graph #1.

A step 203 includes: the base station segmenting a transport block into one or more segments by taking the maximum length of the first predetermined information bit as an upper limit.

A step 204 includes: if the type of the base graph is a second base graph, the base station determining to use the maximum length of the second predetermined information bit for code block segmentation.

As a non-limiting example, the second base graph can be referred to as base graph #2.

A step 205 includes: the base station segmenting the transport block into one or more segments by taking the maximum length of the second predetermined information bit as the upper limit. As a non-limiting example, the lowest code rate of the first base graph is greater than the lowest code rate of the second base graph.

For example, the lowest code rate of the first base graph is 1/3, and the lowest code rate of the second base graph is 1/5, which is not limited to this. Based on the teachings of various embodiments of the present disclosure, those skilled in the art can also reasonably set specific numerical values of the lowest code rate of the first base graph and the lowest code rate of the second base graph, and details are not described herein again.

In the present disclosure, whether to use a maximum length of a first predetermined information bit for code block segmentation or to use a maximum length of a second predetermined information bit for code block segmentation can be determined via signaling indication. For example, since the lowest code rate of the first base graph may only be 1/3, for cell edge users, if the code rate is less than 1/3, by adopting the method in the present embodiment, it can make full use of the maximum length of the second predetermined information bit corresponding to the second base graph corresponding to the code rate of 1/5 for code block segmentation, thereby effectively improving system performance.

Figure 3:
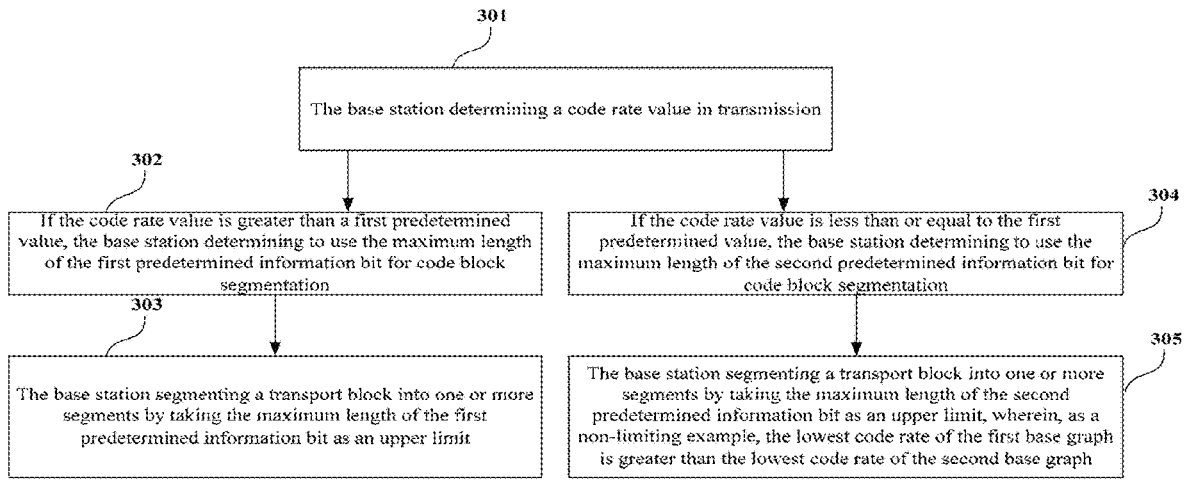
FIG. 3 is yet another flow chart illustrating a code block segmentation method at a base station side according to some embodiments of the present disclosure.

Referring to FIG. 3, yet another flow chart illustrating a code block segmentation method at a base station side according to some embodiments of the present disclosure is illustrated, and the specific steps are as follows.

A step 301 includes: the base station determining a code rate value in transmission.

The base station calculates the code rate value in each transmission according to a transport block size, a scheduled resource size, and a modulation and coding scheme in actual transmission. Or, the base station determines the code rate value in transmission according to indication information.

For example, the indication information can be an MCS Index (Modulation Coding Scheme Index), which is not limited to this.

A step 302 includes: if the code rate value is greater than a first predetermined value, the base station determining to use the maximum length of the first predetermined information bit for code block segmentation.

A step 303 includes: the base station segmenting a transport block into one or more segments by taking the maximum length of the first predetermined information bit as an upper limit.

A step 304 includes: if the code rate value is less than or equal to the first predetermined value, the base station determining to use the maximum length of the second predetermined information bit for code block segmentation.

A step 305 includes: the base station segmenting a transport block into one or more segments by taking the maximum length of the second predetermined information bit as an upper limit, wherein, as a non-limiting example, the lowest code rate of the first base graph is greater than the lowest code rate of the second base graph.

In the present disclosure, whether to use the maximum length of the first predetermined information bit for code block segmentation or to use the maximum length of the second predetermined information bit for code block segmentation can be determined by means of code rate identification. For example, since the lowest code rate of the first base graph may only be 1/3, for cell edge users, if the code rate is less than 1/3, by adopting the method in the present embodiment, it can make full use of the maximum length of the second predetermined information bit corresponding to the second base graph corresponding to the code rate of 1/5 for code block segmentation, thereby improving system performance.

Figure 4:
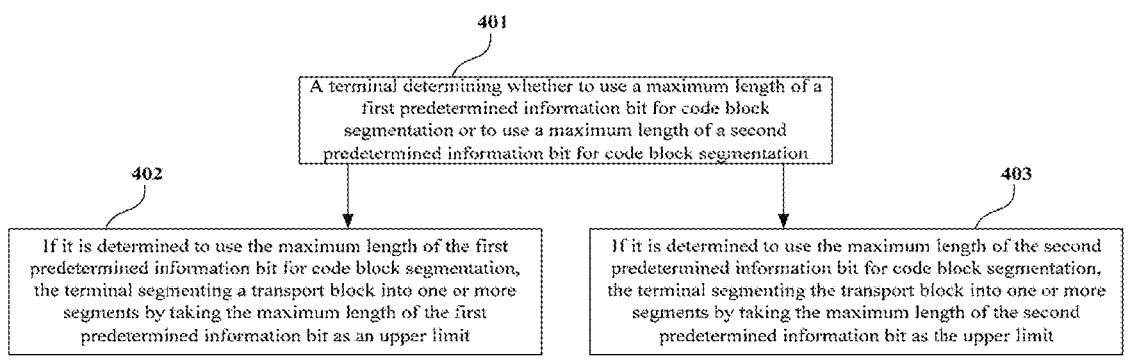
FIG. 4 is a flow chart illustrating a code block segmentation method at a terminal side according to some embodiments of the present disclosure.

Referring to FIG. 4, a flow chart illustrating a code block segmentation method at a terminal side according to some embodiments of the present disclosure is illustrated, and the specific steps are as follows.

A step 401 includes: a terminal determining whether to use a maximum length of a first predetermined information bit for code block segmentation or to use a maximum length of a second predetermined information bit for code block segmentation.

A step 402 includes: if it is determined to use the maximum length of the first predetermined information bit for code block segmentation, the terminal segmenting a transport block into one or more segments by taking the maximum length of the first predetermined information bit as an upper limit.

A step 403 includes: if it is determined to use the maximum length of the second predetermined information bit for code block segmentation, the terminal segmenting the transport block into one or more segments by taking the maximum length of the second predetermined information bit as the upper limit.

As a non-limiting example, the maximum length of the first predetermined information bit is greater than the maximum length of the second predetermined information bit.

In the present disclosure, the first base graph (also referred to as base graph #1) corresponds to the maximum length of the first predetermined information bit, the second base graph (also referred to as base graph #2) corresponds to the maximum length of the second predetermined information bit. If the terminal determines to use the maximum length of the first predetermined information bit for code block segmentation, the terminal segments the transport block into one or more segments by taking the maximum length of the first predetermined information bit as the upper limit; and if the terminal determines to use the maximum length of the second predetermines information bit for code block segmentation, the terminal segments the transport block into one or more segments by taking the maximum length of the second predetermines information bit as the upper limit. The maximum length of the first predetermined information bit is greater than the maximum length of the second predetermined information bit, and it can effectively solve the technical problem of code block segmentation when there are two maximum information block lengths.

Figure 5:
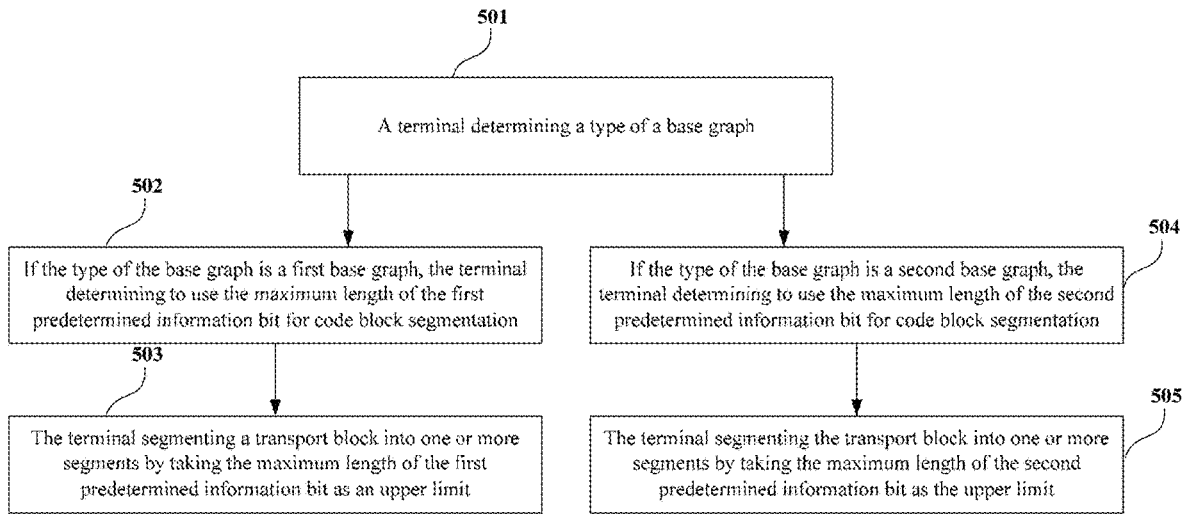
FIG. 5 is another flow chart illustrating a code block segmentation method at a terminal side according to some embodiments of the present disclosure.

Referring to FIG. 5, another flow chart illustrating a code block segmentation method at a terminal side according to some embodiments of the present disclosure is illustrated, and the specific steps are as follows.

A step 501 includes: a terminal determining a type of a base graph.

For example, the terminal determines the type of the base graph via signaling indication from a base station. Specifically, the terminal determines the type of the base graph via dynamic signaling, static signaling or semi-static signaling indication.

A step 502 includes: if the type of the base graph is a first base graph, the terminal determining to use the maximum length of the first predetermined information bit for code block segmentation.

A step 503 includes: the terminal segmenting a transport block into one or more segments by taking the maximum length of the first predetermined information bit as an upper limit.

A step 504 includes: if the type of the base graph is a second base graph, the terminal determining to use the maximum length of the second predetermined information bit for code block segmentation.

As a non-limiting example, the lowest code rate of the first base graph is greater than the lowest code rate of the second base graph.

A step 505 includes: the terminal segmenting the transport block into one or more segments by taking the maximum length of the second predetermined information bit as the upper limit.

In the present disclosure, whether to use the maximum length of the first predetermined information bit for code block segmentation or to use the maximum length of the second predetermined information bit for code block segmentation can be determined via signaling indication. For example, since the lowest code rate of the first base graph may only be 1/3, for cell edge users, if the code rate is less than 1/3, by adopting the method in the present embodiment, it can make full use of the maximum length of the second predetermined information bit corresponding to the second base graph corresponding to the code rate of 1/5 for code block segmentation, thereby improving system performance.

Figure 6:
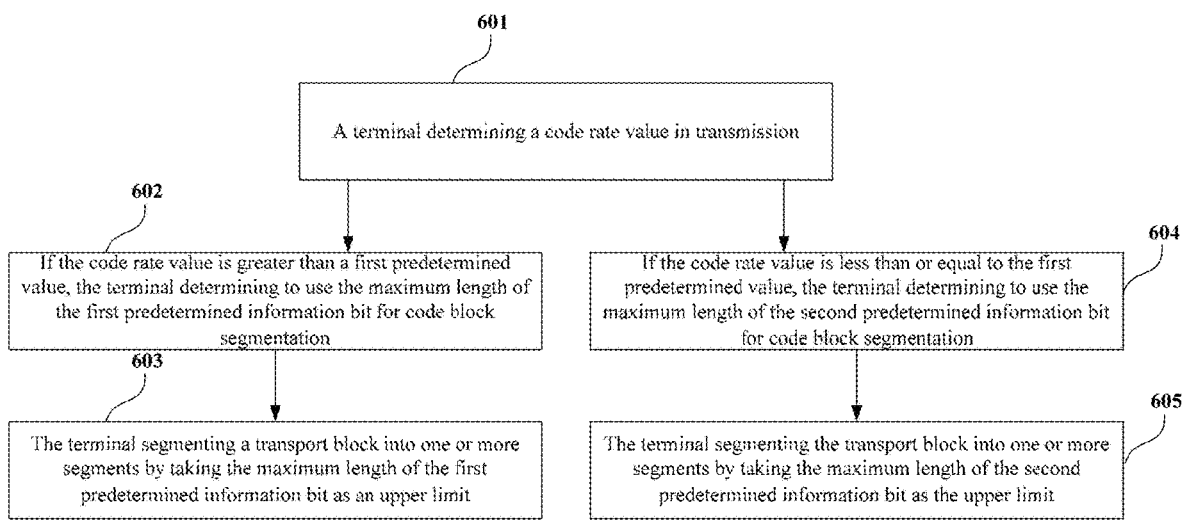
FIG. 6 is yet another flow chart illustrating a code block segmentation method at a terminal side according to some embodiments of the present disclosure.

Referring to FIG. 6, another flow chart illustrating a code block segmentation method at a terminal side according to some embodiments of the present disclosure is illustrated, and the specific steps are as follows.

A step 601 includes: a terminal determining a code rate value in transmission.

For example, the terminal determines the code rate value in transmission according to the signaling indication from a base station. Or, the terminal determines the code rate value in transmission according to indication information.

For example, the indication information can be an MCS Index (Modulation Coding Scheme Index), which is not limited to this.

A step 602 includes: if the code rate value is greater than a first predetermined value, the terminal determining to use the maximum length of the first predetermined information bit for code block segmentation.

A step 603 includes: the terminal segmenting a transport block into one or more segments by taking the maximum length of the first predetermined information bit as an upper limit.

A step 604 includes: if the code rate value is less than or equal to the first predetermined value, the terminal determining to use the maximum length of the second predetermined information bit for code block segmentation.

A step 605 includes: the terminal segmenting the transport block into one or more segments by taking the maximum length of the second predetermined information bit as the upper limit.

In the present disclosure, whether to use the maximum length of the first predetermined information bit for code block segmentation or to use the maximum length of the second predetermined information bit for code block segmentation can be determined by means of code rate identification, For example, since the lowest code rate of the first base graph may only be 1/3, for cell edge users, if the code rate is less than 1/3, by adopting the method in the present embodiment, it can make full use of the maximum length of the second predetermined information bit corresponding to the second base graph corresponding to the code rate of 1/5 for code block segmentation, thereby improving system performance.

The following describes the flow of the code block segmentation method in the embodiment of the present disclosure in combination with two specific methods.

First Method

The base station indicates the type of the base graph via signaling, if use of the base graph #1 is indicated via signaling, the base station or the terminal uses the maximum length of the first predetermined information bit (hereinafter referred to as Kmax1) for code block segmentation, and the transport block is segmented into one or more approximately equal segments by taking the Kmax1 as the upper limit. If use of the base graph #2 is indicated via signaling, the base station or the terminal uses the maximum length of the second predetermined information bit (hereinafter referred to as Kmax2) for code block segmentation, and the transport block is segmented into one or more approximately equal segments by taking the Kmax2 as the upper limit.

A specific scenario: the base station indicates the type of the base graph in DCI by using dynamic signaling of 1 bit, for example, the base graph #1 is represented by 0 in an indication field of the base graph in the DCI, the base graph #2 is represented by 1. The maximum length of the first predetermined information bit Kmax1 is equal to 8448 bits, and the maximum length of the second predetermined information bit Kmax2 is equal to 2560 bits. For example, the TB size is equal to 50000 bits, if the filed value of the base graph is 0, the entire TB is segmented according to the Kmax1 of 8448, if the number of CRCs is 16 bits, the entire TB can be segmented into $C=\lceil 50000/(8448-16) \rceil=6$ segments, the length of each segment is as uniform as possible, such as difference of the lengths is at most 1 bit.

If the field value of the base graph is 1, the entire TB is segmented according to the Kmax2 of 2560, it is assumed again that the number of CRCs is 16 bits, the entire TB can be segmented into $C=\lceil 50000/(2560-16) \rceil=20$ segments, the length of each segment is also as uniform as possible, such as difference of the lengths is at most 1 bit.

It should be noted that the above base graph can be notified via dynamic signaling, and certainly, it can also be notified via static or semi-static signaling.

Second Method

Firstly the code rate is determined (the terminal determines the code rate according to the signaling information indicated by the base station such as an MCS, a TBsize, a size of a allocated resource, but the base station does not need it), if a code rate R is greater than a code rate preset value R0, the code block segmentation is performed on the entire TB according to the maximum length of the first predetermined information bit (hereinafter referred to as Kmax1), and the transport block is segmented into multiple approximately equal segments by taking the Kmax1 as the upper limit. For example, the number of segmented code blocks C is equal to min C', C' is a positive integer, and C' is greater than or equal to TBsize/(Kmax1−L), wherein the L is the length of the adopted CRC bit, and the length of each information bit segment is as equal as possible.

If the code rate value R is less than or equal to a code rate preset value R1, the code block segmentation is performed on the entire TB according to the maximum length of the second predetermined information bit Kmax2, and the transport block is segmented into one or more approximately equal segments by taking the Kmax2 as the upper limit, wherein the R0 is greater than the R1.

A specific scenario: it is assumed that the maximum length of the first predetermined information bit Kmax1 is equal to 8448 bits, and the maximum length of the second predetermined information bit Kmax2 is equal to 2560 bits. It is assumed that the TBsize is equal to 30000 bits. If the code rate value in transmission determined by the base station is greater than R0 of 1/3, the entire TB is segmented according to the Kmax1 of 8448, it is assumed that the number of the CRCs is 16 bits, the entire TB is segmented into C=⌈30000/(8448−16)⌉=4 segments, the length of each segment is also as uniform as possible, such as difference of the lengths is at most 1 bit. If the code rate value in transmission determined by the base station is less than R1 of 1/5, the entire TB is segmented according to the Kmax1 of 2560, it is assumed that the number of the CRCs is 16 bits, the entire TB is segmented into C=⌈30000/(2560−16)⌉=12 segments, the length of each segment is also as uniform as possible, such as difference of the lengths is at most 1 bit.

It should be noted that the above R0 of 1/3 is only an example and does not exclude other values, and the above R1 of 1/5 is only an example and does not exclude other values.

Optionally, the method for determining the code rate can be: specifically calculating the code rate value on each transmission according to a transport block size, a scheduled resource size, and a modulation scheme.

Optionally, the code rate on the actual transmission is determined according to indication information (for example, the indication information may be an MCS Index), which avoids complicated calculations. The MCS of the LTE is taken as an example:

TABLE

Modulation and TBS index table (Modulation and Tranport Block index correspondence table, referred to as an MSC table)

| MCS Index $I_{MCS}$ | Modulation Order $Q_m$ | TBS Index $I_{TBS}$ |
|---|---|---|
| 0 | 2 | 0 |
| 1 | 2 | 1 |
| 2 | 2 | 2 |

TABLE-continued

Modulation and TBS index table (Modulation and Tranport Block index correspondence table, referred to as an MSC table)

| MCS Index $I_{MCS}$ | Modulation Order $Q_m$ | TBS Index $I_{TBS}$ |
|---|---|---|
| 3 | 2 | 3 |
| 4 | 2 | 4 |
| 5 | 2 | 5 |
| 6 | 2 | 6 |
| 7 | 2 | 7 |
| 8 | 2 | 8 |
| 9 | 2 | 9 |
| 10 | 4 | 9 |
| 11 | 4 | 10 |
| 12 | 4 | 11 |
| 13 | 4 | 12 |
| 14 | 4 | 13 |
| 15 | 4 | 14 |
| 16 | 4 | 15 |
| 17 | 6 | 15 |
| 18 | 6 | 16 |
| 19 | 6 | 17 |
| 20 | 6 | 18 |
| 21 | 6 | 19 |
| 22 | 6 | 20 |
| 23 | 6 | 21 |
| 24 | 6 | 22 |
| 25 | 6 | 23 |
| 26 | 6 | 24 |
| 27 | 6 | 25 |
| 28 | 6 | 26 |
| 29 | 2 | reserved |
| 30 | 4 | |
| 31 | 6 | |

Each row of the MSC table represents a different code rate actually, see 3GPP document R1-081638, but the code rate implied in the MCS table is only the target value, which is not exactly the same as the code rate in actual transmission, but can meet the requirement of code rate for the code block segmentation, it is a simple and efficient way to utilize the code rate implied in the MCS table to identify different code rates to implement the code block segmentation.

Figure 7:
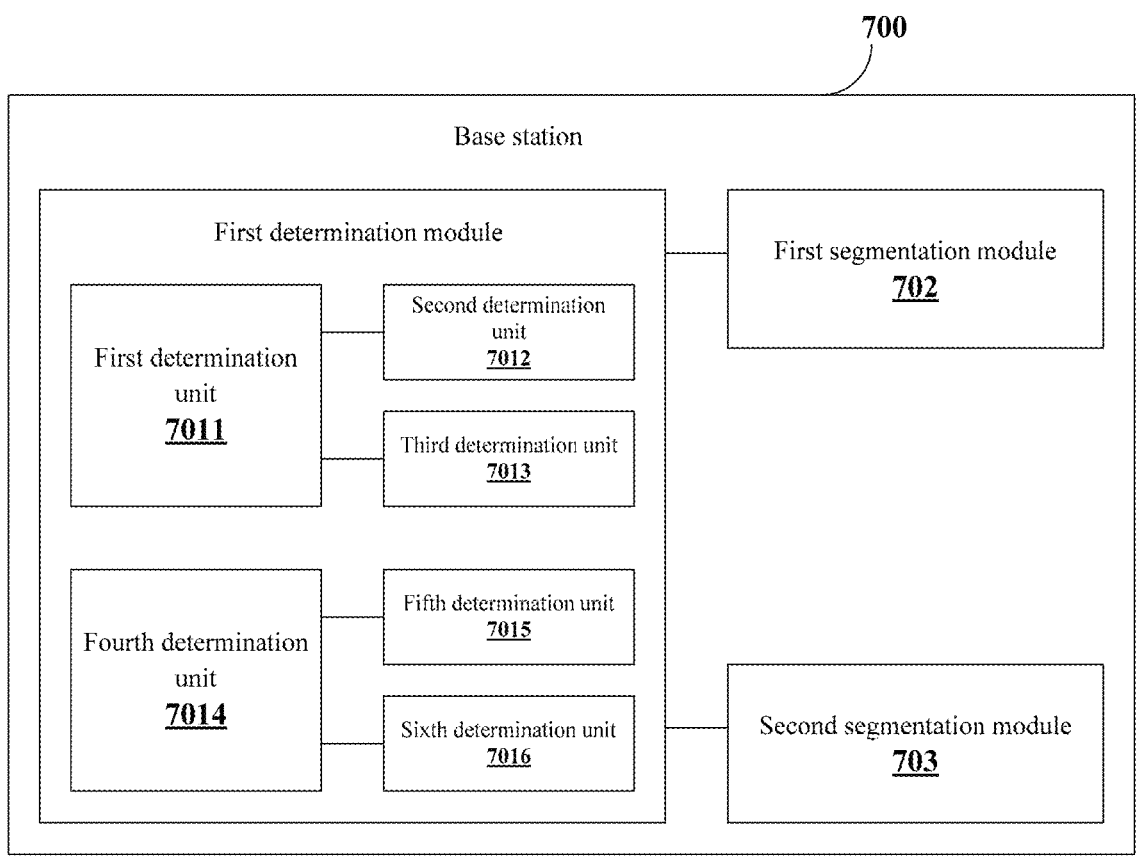
FIG. 7 is a structural diagram illustrating a base station according to some embodiments of the present disclosure.

Referring to FIG. 7, a structure of a base station 700 according to some embodiments of the present disclosure is illustrated, and the base station 700 includes:

a first determination module 701, configured to determine whether to use a maximum length of a first predetermined information bit for code block segmentation or to use a maximum length of a second predetermined information bit for code block segmentation;

a first segmentation module 702 configured to, if the first determination module determines to use the maximum length of the first predetermined information bit for code block segmentation, segment a transport block into one or more segments by taking the maximum length of the first predetermined information bit as an upper limit; and a second segmentation module 703 configured to, if the first determination module determines to use the maximum length of the second predetermined information bit for code block segmentation, segment the transport block into one or more segments by taking the maximum length of the second predetermined information bit as the upper limit;

wherein the maximum length of the first predetermined information bit is greater than the maximum length of the second predetermined information bit.

Optionally, with continued reference to FIG. 7, the first determination module 701 includes:

a first determination unit 7011, configured to determine a type of a base graph;

a second determination unit 7012 configured to, if the type of the base graph is a first base graph, determine to use the maximum length of the first predetermined information bit for code block segmentation;

a third determination unit 7013 configured to, if the type of the base graph is a second base graph, determine to use the maximum length of the second predetermined information bit for code block segmentation;

wherein a lowest code rate of the first base graph is greater than a lowest code rate of the second base graph.

Optionally, the first determination unit 7011 is further configured to: indicate the type of the base graph via signaling.

Optionally, the first determination unit 7011 is further configured to: indicate the type of the base graph via dynamic signaling, static signaling or semi-static signaling.

Optionally, with continued reference to FIG. 7, the first determination module 701 includes:

a fourth determination unit 7014, configured to determine a code rate value in transmission;

a fifth determination unit 7015 configured to, if the code rate value is greater than a first predetermined value, determine to use the maximum length of the first predetermined information bit for code block segmentation;

a sixth determination unit 7016 configured to, if the coding rate value is less than or equal to the first predetermined value, determine to use the maximum length of the second predetermined information bit for code block segmentation;

Optionally, the fourth determination unit 7014 is further configured to: calculate the code rate value in each transmission according to a transport block size, a scheduled resource size, and a modulation and coding scheme in actual transmission.

Optionally, the fourth determination unit 7014 is further configured to: determine the code rate value in transmission according to indication information.

The base station provided in the present embodiment can implement the above method embodiment, the implementation principle and technical effect thereof are similar, which are not described here in the present embodiment.

Figure 8:
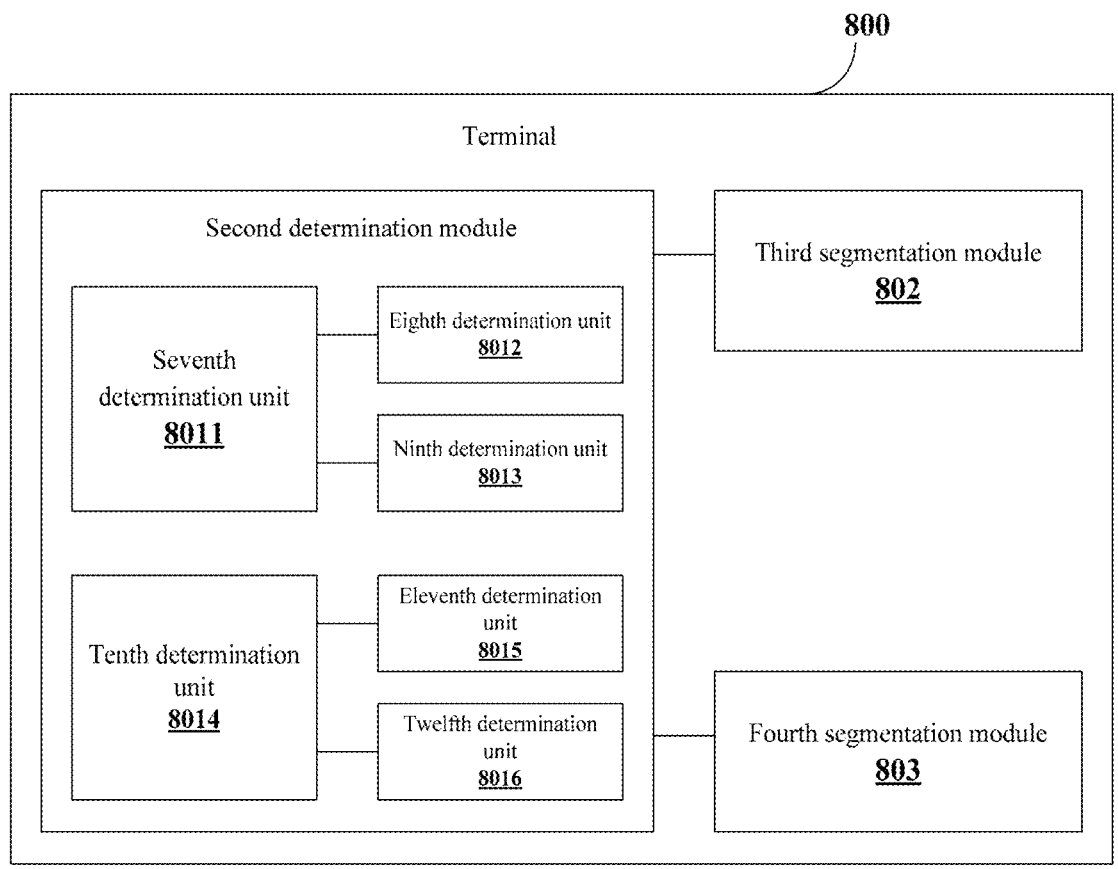
FIG. 8 is a structural diagram illustrating a terminal according to some embodiments of the present disclosure.

Referring to FIG. 8, a structure of a base station 800 according to some embodiments of the present disclosure is illustrated, and the base station 800 includes:

a second determination module 801, configured to determine whether to use a maximum length of a first predetermined information bit for code block segmentation or to use a maximum length of a second predetermined information bit for code block segmentation;

a third segmentation module 802 configured to, if the second determination module determines to use the maximum length of the first predetermined information bit for code block segmentation, segment a transport block into one or more segments by taking the maximum length of the first predetermined information bit as an upper limit; and a fourth segmentation module 803 configured to, if the second determination module determines to use the maximum length of the second predetermined information bit for code block segmentation, segment the transport block into one or more segments by taking the maximum length of the second predetermined information bit as the upper limit;

wherein the maximum length of the first predetermined information bit is greater than the maximum length of the second predetermined information bit.

Optionally, the second determination module 801 includes:

a seventh determination unit 8011, configured to determine a type of a base graph;

an eighth determination unit 8012 configured to, if the type of the base graph is a first base graph, determine to use the maximum length of the first predetermined information bit for code block segmentation;

a ninth determination unit 8013 configured to, if the type of the base graph is a second base graph, determine to use the maximum length of the second predetermined information bit for code block segmentation;

wherein a lowest code rate of the first base graph is greater than a lowest code rate of the second base graph.

Optionally, the seventh determination unit 8011 is further configured to: determine the type of the base graph via signaling indication from a base station.

Optionally, the seventh determination unit 8011 is further configured to: determine the type of the base graph via dynamic signaling, static signaling or semi-static signaling indication from the base station.

Optionally, the second determination module 801 includes:

a tenth determination unit 8014, configured to determine a code rate value in transmission;

an eleventh determination unit 8015 configured to, if the code rate value is greater than a first predetermined value, determine to use the maximum length of the first predetermined information bit for code block segmentation;

a twelfth determination unit 8016 configured to, if the coding rate value is less than or equal to the first predetermined value, determine to use the maximum length of the second predetermined information bit for code block segmentation.

Optionally, the tenth determination unit 8014 is further configured to: determine a code rate value in transmission according to the signaling indication from a base station.

Optionally, the tenth determination unit 8014 is further configured to: determine the code rate value in transmission according to indication information.

The terminal provided in the present embodiment can implement the above method embodiment, the implementation principle and technical effect thereof are similar, which are not described here in the present embodiment.

Figure 9:
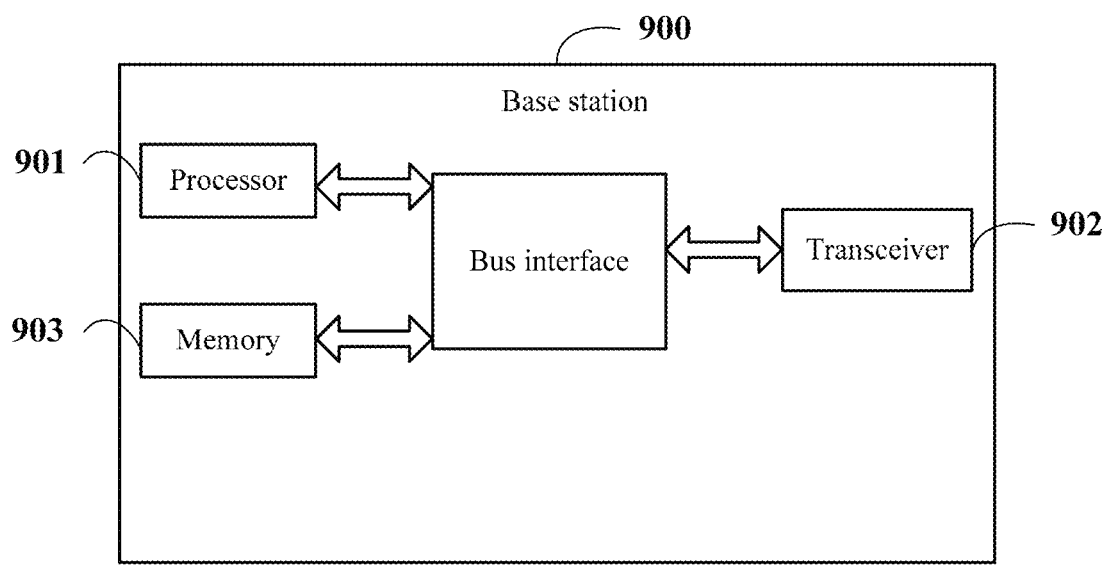
FIG. 9 is another structural diagram illustrating a base station according to some embodiments of the present disclosure.

Referring to FIG. 9, FIG. 9 is a structural diagram of a base station applied in an embodiment of the present disclosure, which can implement the details of the uplink power control method in the corresponding embodiments described above, and achieve the same or similar effects. As shown in FIG. 9, the base station 900 includes: a processor 901, a transceiver 902, a memory 903 and a bus interface.

In an embodiment of the present disclosure, the base station 900 further includes: a computer program stored in the memory 903 and executable on the processor 901, wherein the computer program is executed by the processor 901 to implement the following steps: determining whether to use a maximum length of a first predetermined information bit for code block segmentation or to use a maximum length of a second predetermined information bit for code block segmentation; if it is determined to use the maximum length of the first predetermined information bit for code block segmentation, segmenting a transport block into one or more segments by taking the maximum length of the first predetermined information bit as an upper limit; and if it is determined to use the maximum length of the second predetermined information bit for code block segmentation, segmenting the transport block into one or more segments by taking the maximum length of the second predetermined information bit as the upper limit; wherein the maximum length of the first predetermined information bit is greater than the maximum length of the second predetermined information bit.

In FIG. 9, the bus architecture may include any number of interconnected buses and bridges, specifically linked by one or more processors represented by processor 901 and various circuits of the memory represented by memory 903. The bus architecture can also link various other circuits such as peripherals, voltage regulators, and power management circuits, etc., which are well known in the art and, therefore, will not be further described herein. The bus interface provides an interface. The transceiver 902 can be a plurality of components, that is, including a transmitter and a receiver, to provide units for communicating with various other devices on a transmission medium. For different user equipments, the bus interface can also be an interface capable of externally connecting or internally connecting the required devices including but not limited to, a keypad, a display, a speaker, a microphone, a joystick, and the like.

The processor 901 is responsible for managing the bus architecture and general processing, and the memory 903 can store data used by the processor 901 when performing operations.

Optionally, the processor 901 can invoke a program or an instruction stored in the memory 903 to implement the following procedures: determining a type of a base graph; if the type of the base graph is a first base graph, determining to use the maximum length of the first predetermined information bit for code block segmentation; and if the type of the base graph is a second base graph, determining to use the maximum length of the second predetermined information bit for code block segmentation; wherein a lowest code rate of the first base graph is greater than a lowest code rate of the second base graph.

Optionally, the processor 901 can invoke a program or an instruction stored in the memory 903 to implement the following procedures: determining a code rate value in transmission; if the code rate value is greater than a first predetermined value, determining to use the maximum length of the first predetermined information bit for code block segmentation; and if the code rate value is less than or equal to the first predetermined value, determining to use the maximum length of the second predetermined information bit for code block segmentation; wherein the maximum length of the first predetermined information bit is greater than the maximum length of the second predetermined information bit.

The base station provided in the present embodiment can implement the above method embodiment, the implementation principle and technical effect thereof are similar, which are not described here in the present embodiment.

Figure 10:
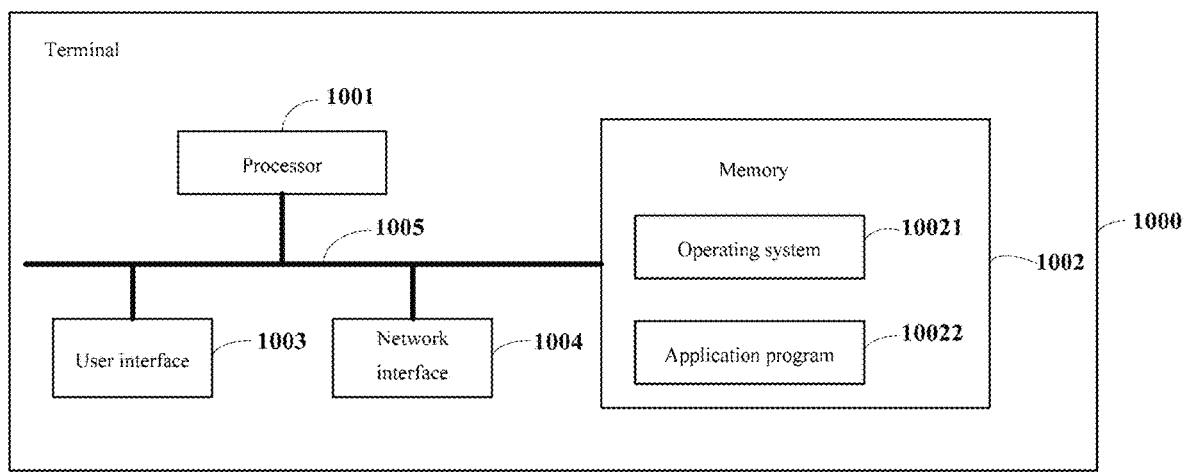
FIG. 10 is another structural diagram illustrating a terminal according to some embodiments of the present disclosure.

FIG. 10 is another structural schematic diagram illustrating a terminal provided by some embodiments of the present disclosure. As shown in FIG. 10, the terminal 1000 shown in FIG. 10 includes: at least one processor 1001, a memory 1002, at least one network interface 1004 and a user interface 1003. The various components in terminal 1000 are coupled together by a bus system 605. It will be appreciated that the bus system 1005 is used to implement connection communication between these components. The bus system 1005 includes a power bus, a control bus, and a status signal bus in addition to the data bus. However, for clarity of description, various buses are labeled as the bus system 1005 in FIG. 10.

The user interface 1003 can include a display, a keyboard or a pointing device (e.g., a mouse, a track ball, a touchpad or a touch screen, etc.).

It is to be understood that the memory 1002 in this disclosure can be either a volatile memory or a non-volatile memory, or can include both the volatile and the non-volatile memory. The non-volatile memory may be a Read-Only Memory (ROM), a Programmable ROM (PROM), an Erasable PROM (EPROM), or an Electrically EPROM (EEPROM) or a flash memory. The volatile memory can be a Random Access Memory (RAM) that acts as an external cache. By way of example and not limitation, many forms of RAM are available, such as a Static RAM (SRAM), a Dynamic RAM (DRAM), a Synchronous DRAM (SDRAM), a Double Data Rate SDRAM (DDRSDRAM), an Enhanced SDRAM (ESDRAM), a Synchlink DRAM (SLDRAM) and a Direct Rambus RAM (DRRAM). The memory 1002 of the systems and methods described in the embodiment of the present disclosure is intended to include, but is not limited to, these and any other suitable types of memory.

In some embodiments, the memory 1002 stores the following elements, an executable module or a data structure, or a subset thereof, or an extended set thereof: an operating system 10021 and an application program 10022.

The operating system 10021 includes various system programs, such as a framework layer, a core library layer, a driver layer, and the like, for implementing various basic services and processing hardware-based tasks. The application program 10022 includes various application programs, such as a media player, a browser, and the like, for implementing various application services. A program implementing the methods of the present disclosure can be included in the application program 10022.

In some embodiments of the present disclosure, by invoking the program or the instruction stored in the memory 1002, specifically, which may be the program or the instruction stored in the application program 10022, the processor 1001 can implement the method implemented by the terminal.

The above method disclosed in the embodiment of the present disclosure may be applied to the processor 1001 or implemented by the processor 1001. The processor 1001 may be an integrated circuit chip having a processing capability of signals. In the implementation procedure, each step of the foregoing method may be completed by an integrated logic circuit of hardware or by an instruction in a form of software in the processor 1001. The processor 1001 can be a general-purpose processor, a digital signal processor (DSP), an application specific integrated circuit (ASIC), a field programmable gate array (FPGA), other programmable logic devices, a discrete gate or a transistor logic device, or a discrete hardware component. Various method, step, and logical block diagram disclosed in the embodiment of the present disclosure may be implemented or carried out. The general purpose processor may be a microprocessor, any conventional processor or the like. The steps of the method disclosed in the embodiment of the present disclosure may be embodied directly by the hardware decoding processor, or by a combination of hardware and software modules in the hardware decoding processor. The software module can be located in a conventional storage medium known in the art such as a random access memory, a flash memory, a read only memory, a programmable read only memory or an electrically erasable programmable memory, a register, and the like. The storage medium is located in the memory 1002, and the processor 1001 reads information in the memory 1002 and completes the steps of the above method in combination with its hardware.

It is to be understood that the embodiments described in embodiments of the present disclosure can be implemented in hardware, software, firmware, middleware, microcode, or any combination thereof. For a hardware implementation, a processing unit can be implemented within one or more Application Specific Integrated Circuits (ASICs), Digital Signal Processors (DSPs), Digital Signal Processing Devices (DSPDevices, DSPDs), Programmable Logic Devices (PLDs), Field-Programmable Gate Arrays (FPGAs), general processors, controllers, micro-controllers, microprocessors, other electronic units designed to perform the functions described in an embodiment of the present disclosure, or a combination thereof.

For software implementation, the techniques described in an embodiment of the present disclosure can be implemented by modules (e.g., procedures, functions, etc.) that perform the functions described in an embodiment of the present disclosure. The software code can be stored in the memory and executed by the processor. The memory can be implemented within the processor or external to the processor.

Specifically, the processor 1001 can invoke a program or an instruction stored in the memory 1002 to implement the following procedures: determining whether to use a maximum length of a first predetermined information bit for code block segmentation or to use a maximum length of a second predetermined information bit for code block segmentation; if it is determined to use the maximum length of the first predetermined information bit for code block segmentation, segmenting a transport block into one or more segments by taking the maximum length of the first predetermined information bit as an upper limit; and if it is determined to use the maximum length of the second predetermined information bit for code block segmentation, segmenting the transport block into one or more segments by taking the maximum length of the second predetermined information bit as the upper limit; wherein the maximum length of the first predetermined information bit is greater than the maximum length of the second predetermined information bit.

Optionally, the processor 1001 can invoke a program or an instruction stored in the memory 1002 to implement the following procedures: determining a type of a base graph; if the type of the base graph is a first base graph, determining to use the maximum length of the first predetermined information bit for code block segmentation; and if the type of the base graph is a second base graph, determining to use the maximum length of the second predetermined information bit for code block segmentation; wherein a lowest code rate of the first base graph is greater than a lowest code rate of the second base graph.

Optionally, the processor 1001 can invoke a program or an instruction stored in the memory 1002 to implement the following procedures: determining a code rate value in transmission; if the code rate value is greater than a first predetermined value, determining to use the maximum length of the first predetermined information bit for code block segmentation; and if the code rate value is less than or equal to the first predetermined value, determining to use the maximum length of the second predetermined information bit for code block segmentation; wherein the maximum length of the first predetermined information bit is greater than the maximum length of the second predetermined information bit.

The base station provided in the present embodiment can implement the above method embodiment, the implementation principle and technical effect thereof are similar, which are not described here in the present embodiment.

An embodiment of the present disclosure further provides a computer readable storage medium having a computer program stored therein, wherein the program is executed by a processor to implement steps of the code block segmentation method shown in FIG. 1 to FIG. 6.

It should be understood that "an embodiment" or "one embodiment" mentioned throughout the specification means that a particular feature, a structure, or a characteristic related to the embodiment is included in at least one embodiment of the present disclosure. Thus, "in an embodiment" or "in one embodiment" shown throughout the specification is not necessarily referring to the same embodiment. Furthermore, the particular features, structures, or characteristics may be combined in any suitable manner in one or more embodiments.

In various embodiments of the present disclosure, it should be understood that the size of the serial numbers of the above procedures does not mean the order of execution, the execution order of each process should be determined by its function and internal logic, and should not constitute any limitation on the implementation process of the embodiments of the present disclosure.

In addition, the terms "system" and "network" are often used interchangeably herein.

It should be understood that the term "and/or" herein is only an association relationship describing the associated objects, which means that there can be three kinds of relationships, for example, A and/or B can mean these three cases: A exists alone, A and B exist simultaneously, and B exists alone. In addition, the character "/" herein generally indicates that the related objects have an "or" relationship.

In the embodiments provided in this application, it should be understood that "B corresponding to A" means that B is associated with A, and B can be determined according to A. However, it should also be understood that determining B based on A does not mean determining B based solely on A, but also determining B based on A and/or other information.

In some embodiments provided by the present application, it should be noted that, the disclosed method and device can be implemented in other means. For example, the device embodiments described above are merely illustrative. For example, the division of the unit is only a logical function division. In actual implementation, there may be additional division manner, for example, a plurality of units or components may be combined or may be integrated into another system, or some features can be ignored or not be executed. In addition, the mutual coupling or direct coupling or communication connection shown or discussed may be an indirect coupling or a communication connection through some interface, device or unit, and may be in an electrical, mechanical or other form.

In addition, each functional unit in various embodiments of the present disclosure may be integrated into one processing unit, or each unit may exist physically separately, or two or more units may be integrated into one unit. The integrated unit may be implemented through hardware, or may also be implemented in a form of hardware plus a software functional module.

The integrated unit implemented in the form of a software functional module can be stored in a computer readable storage medium. The above software functional module store in a computer readable storage medium, including an instruction for a computing device (e.g., a personal computer, or a network side device, etc.) to execute some steps of the messaging method described in each embodiment of the present disclosure. The above storage medium includes various media that can store program codes, such as a USB flash drive, a mobile hard disk, a Read-Only Memory (ROM), a Random Access Memory (RAM), a magnetic disk, an optical disk or the like.

The descriptions above are preferred embodiments of the disclosure, it should be noted that the improvements and the embellishments within the scope of the tenets of the disclosure shall be within the protection range of the disclosure to those of ordinary skill in the art.

What is claimed is:

1. A code block segmentation method, comprising:
a base station determining whether to use a maximum length of a first predetermined information bit for code block segmentation or to use a maximum length of a second predetermined information bit for code block segmentation;
if it is determined to use the maximum length of the first predetermined information bit for code block segmentation, the base station segmenting a transport block into one or more segments by taking the maximum length of the first predetermined information bit as an upper limit;
if it is determined to use the maximum length of the second predetermined information bit for code block segmentation, the base station segmenting the transport block into one or more segments by taking the maximum length of the second predetermined information bit as the upper limit,
wherein the maximum length of the first predetermined information bit is greater than the maximum length of the second predetermined information bit.

2. The method according to claim 1, wherein the base station determining whether to use a maximum length of a first predetermined information bit for code block segmentation or to use a maximum length of a second predetermined information bit for code block segmentation comprises:
the base station determining a type of a base graph;
if the type of the base graph is a first base graph, the base station determining to use the maximum length of the first predetermined information bit for code block segmentation;
if the type of the base graph is a second base graph, the base station determining to use the maximum length of the second predetermined information bit for code block segmentation,
wherein a lowest code rate of the first base graph is greater than a lowest code rate of the second base graph.

3. The method according to claim 2, wherein after the base station determining a type of a base graph, the method further comprises:
the base station indicating the type of the base graph via signaling.

4. The method according to claim 3, wherein the base station indicating the type of the base graph via signaling comprises:
the base station indicating the type of the base graph via dynamic signaling, static signaling or semi-static signaling.

5. The method according to claim 1, wherein the base station determining whether to use a maximum length of a first predetermined information bit for code block segmentation or to use a maximum length of a second predetermined information bit for code block segmentation comprises:
the base station determining a code rate value in transmission;
if the code rate value is greater than a first predetermined value, the base station determining to use the maximum length of the first predetermined information bit for code block segmentation;
if the code rate value is less than or equal to the first predetermined value, the base station determining to use the maximum length of the second predetermined information bit for code block segmentation,
wherein the maximum length of the first predetermined information bit is greater than the maximum length of the second predetermined information bit.

6. The method according to claim 5, wherein the base station determining a code rate value in transmission comprises:
the base station calculating the code rate value in each transmission according to a transport block size, a scheduled resource size, and a modulation and coding scheme in actual transmission.

7. The method according to claim 5, wherein the base station determining a code rate value in transmission comprises:
the base station determining the code rate value in transmission according to indication information.

8. A code block segmentation method, comprising:
a terminal determining whether to use a maximum length of a first predetermined information bit for code block segmentation or to use a maximum length of a second predetermined information bit for code block segmentation;
if it is determined to use the maximum length of the first predetermined information bit for code block segmentation, the terminal segmenting a transport block into one or more segments by taking the maximum length of the first predetermined information bit as an upper limit;
if it is determined to use the maximum length of the second predetermined information bit for code block segmentation, the terminal segmenting the transport block into one or more segments by taking the maximum length of the second predetermined information bit as the upper limit,
wherein the maximum length of the first predetermined information bit is greater than the maximum length of the second predetermined information bit.

9. The method according to claim 8, wherein the terminal determining whether to use a maximum length of a first predetermined information bit for code block segmentation or to use a maximum length of a second predetermined information bit for code block segmentation comprises:
the terminal determining a type of a base graph;
if the type of the base graph is a first base graph, the terminal determining to use the maximum length of the first predetermined information bit for code block segmentation;
if the type of the base graph is a second base graph, the terminal determining to use the maximum length of the second predetermined information bit for code block segmentation,
wherein a lowest code rate of the first base graph is greater than a lowest code rate of the second base graph.

10. The method according to claim 9, wherein the terminal determining a type of a base graph comprises:
the terminal determining the type of the base graph via signaling indication from a base station.

11. The method according to claim 10, wherein the terminal determining the type of the base graph via signaling indication from a base station comprises:
the terminal determining the type of the base graph via dynamic signaling, static signaling or semi-static signaling indication from the base station.

12. The method according to claim 8, wherein the terminal determining whether to use a maximum length of a first predetermined information bit for code block segmentation or to use a maximum length of a second predetermined information bit for code block segmentation comprises:
the terminal determining a code rate value in transmission;
if the code rate value is greater than a first predetermined value, the terminal determining to use the maximum length of the first predetermined information bit for code block segmentation;
if the code rate value is less than or equal to the first predetermined value, the terminal determining to use the maximum length of the second predetermined information bit for code block segmentation,
wherein the maximum length of the first predetermined information bit is greater than the maximum length of the second predetermined information bit.

13. The method according to claim 12, wherein the terminal determining a code rate value in transmission comprises:
the terminal determining a code rate value in transmission according to the signaling indication from a base station.

14. The method according to claim 12, wherein the terminal determining a code rate value in transmission comprises:
the terminal determining the code rate value in transmission according to indication information.

15. A base station, comprising a memory, a processor and a computer program stored in the memory and executable on the processor; wherein the processor executes the program to implement a code block segmentation method, comprising:
the base station determining whether to use a maximum length of a first predetermined information bit for code block segmentation or to use a maximum length of a second predetermined information bit for code block segmentation;
if it is determined to use the maximum length of the first predetermined information bit for code block segmentation, the base station segmenting a transport block into one or more segments by taking the maximum length of the first predetermined information bit as an upper limit;
if it is determined to use the maximum length of the second predetermined information bit for code block segmentation, the base station segmenting the transport block into one or more segments by taking the maximum length of the second predetermined information bit as the upper limit,
wherein the maximum length of the first predetermined information bit is greater than the maximum length of the second predetermined information bit.

16. The base station according to claim 15, wherein the base station determining whether to use a maximum length of a first predetermined information bit for code block segmentation or to use a maximum length of a second predetermined information bit for code block segmentation comprises:
the base station determining a type of a base graph;
if the type of the base graph is a first base graph, the base station determining to use the maximum length of the first predetermined information bit for code block segmentation;
if the type of the base graph is a second base graph, the base station determining to use the maximum length of the second predetermined information bit for code block segmentation,
wherein a lowest code rate of the first base graph is greater than a lowest code rate of the second base graph.

17. The base station according to claim 16, wherein, after the base station determining a type of a base graph, the base station indicates the type of the base graph via signaling.

18. A terminal, comprising a memory, a processor and a computer program stored in the memory and executable on the processor; wherein the processor executes the program to implement a code block segmentation method, comprising:
the terminal determining whether to use a maximum length of a first predetermined information bit for code block segmentation or to use a maximum length of a second predetermined information bit for code block segmentation;
if it is determined to use the maximum length of the first predetermined information bit for code block segmentation, the terminal segmenting a transport block into one or more segments by taking the maximum length of the first predetermined information bit as an upper limit;
if it is determined to use the maximum length of the second predetermined information bit for code block segmentation, the terminal segmenting the transport block into one or more segments by taking the maximum length of the second predetermined information bit as the upper limit,
wherein the maximum length of the first predetermined information bit is greater than the maximum length of the second predetermined information bit.

19. The method according to claim 18, wherein the terminal determining whether to use a maximum length of a first predetermined information bit for code block segmentation or to use a maximum length of a second predetermined information bit for code block segmentation comprises:
the terminal determining a type of a base graph;
if the type of the base graph is a first base graph, the terminal determining to use the maximum length of the first predetermined information bit for code block segmentation;
if the type of the base graph is a second base graph, the terminal determining to use the maximum length of the second predetermined information bit for code block segmentation,
wherein a lowest code rate of the first base graph is greater than a lowest code rate of the second base graph.

20. The terminal according to claim 19, wherein the terminal determines the type of the base graph via signaling indication from a base station.

* * * * *